United States Patent [19]
Fehlner et al.

[11] Patent Number: 5,372,860
[45] Date of Patent: Dec. 13, 1994

[54] SILICON DEVICE PRODUCTION

[75] Inventors: Francis P. Fehlner; Paul A. Sachenik, both of Corning, N.Y.

[73] Assignee: Corning Incorporated, Corning, N.Y.

[21] Appl. No.: 86,661

[22] Filed: Jul. 6, 1993

[51] Int. Cl.$^5$ .............................................. C23C 16/00
[52] U.S. Cl. ................................. 427/578; 427/248.1; 427/397.7; 427/402
[58] Field of Search .................. 427/578, 248.1, 397.7, 427/402

[56] References Cited

U.S. PATENT DOCUMENTS 4,452,828  6/1984  Namba et al. ....................... 427/574
5,213,670  5/1993  Bertagnolli et al. ............. 427/248.1
5,246,744  9/1993  Matsuda et al. ..................... 427/574

Primary Examiner—Janyce Bell
Attorney, Agent, or Firm—Milton M. Peterson; Clinton S. Janes, Jr.

[57] ABSTRACT

A method for producing a glass panel for silicon device fabrication, which method comprises forming a non-crystalline, or mixed-phase, silicon film on a glass substrate, the glass having a strain point greater than 560° C., and subjecting the filmed glass to a heat treatment comprising heating at a temperature of at least 550° C. for a period of time sufficient to convert the silicon film to polycrystalline silicon and to compact the glass.

14 Claims, 1 Drawing Sheet

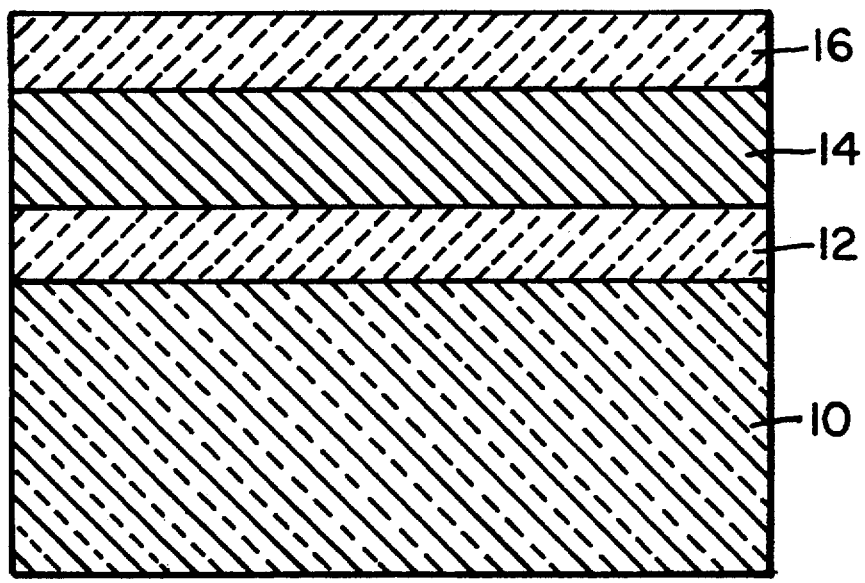

SILICON DEVICE PRODUCTION

FIELD OF THE INVENTION

The field of the invention is production of a glass panel for use in fabrication of a silicon device, such as a liquid crystal display device.

BACKGROUND OF THE INVENTION

Silicon finds wide application in electronic device production. One particular utility is thin film transistors (TFTs). Such transistors are critical components in numerous devices. A device of great interest currently is a liquid crystal display (LCD).

It is a goal of the silicon device industry, and especially active matrix liquid crystal device (AMLCD) production, to achieve higher performance by replacing amorphous silicon (a-Si) thin film transistors (TFTs) with a polycrystalline silicon (poly-Si) version. This change would result in higher on-currents, better frequency response, larger displays, and potentially longer life-times. It would be possible to implement peripheral circuitry, as well as pixel switches, on the glass substrate. This would greatly reduce the number of external connections to the substrate, thus increasing reliability and reducing cost.

Poly-Si TFTs are very attractive for the above reasons. The poly-Si film required for TFT fabrication can be formed directly on a flat glass substrate with a high strain point. Such glasses have been proposed, for example, in U.S. Pat. Nos. 5,116,787 and 5,116,789 (Dumbaugh, Jr. et al.).

Alternatively, a noncrystalline film, or a mixed-phase film, can be deposited and then heat treated to form a polycrystalline film. M. K. Hatalis et al. explain in "Low Temperature Polysilicon Thin Film Transistors on Corning Code 1734 and 1735 Glass Substrates", *Proceedings of the Society for Information Display*, 1993, pp 724–7, the process for depositing a "mixed-phase" film. The deposited silicon film consists of a mixture of noncrystalline and crystalline regions, with the material becoming completely polycrystalline during a subsequent heat treatment. This procedure is preferred because it produces a film with a larger grain size for higher electron mobility and a smoother surface for subsequent gate dielectric deposition.

Again, a glass exhibiting a high strain point is demanded as is discussed by Hatalis et al., supra. If, however, the glass is compacted via a combined non-damage anneal/crystallization process, then glasses demonstrating somewhat lower strain points, such as Corning Code 7059 glass with a nominal strain point of 593° C., can be utilized. Hatalis et al. reported crystallizing a mixed-phase film by a heat treatment of 12 hours at 550° C. and crystallizing a noncrystalline film by a heat treatment of 36 hours at 550° C. Accordingly, it can be appreciated that heat treating at a higher temperature, i.e., one no lower than about 10° C. below the glass strain point, e.g., 580°-590° C., would result in shorter process times for concurrent compaction and crystallization. A relationship between time and temperature is shown in FIG. 1 of a paper by N. A. Blum and C. Feldman, "The Crystallization of Amorphous Silicon Films", *Journal of Non-Crystalline Solids*, 11, pp. 242–6 (1972), for silicon films deposited by electron beam deposition. Substrate temperature was 200°-300° C.

Liquid crystal display devices, whether passive or active, customarily embody thin, parallel, spaced glass panels with an intermediate liquid crystal layer.

A passive display device relies upon the threshold properties of the liquid crystal material. In an active device, the back panel, or active plane, has electronic switching devices, such as thin film transistors (TFTs). These are formed on the panel by photolithographic steps, together with attached circuitry. The front panel, or color plane, has transparent, colored dots, or stripes, in the case of a full color display.

Fabrication of the active plane, or active matrix, involves the use of multiple photolithographic steps which require precise alignment. This requires that the panels not only have precise dimensions as formed, but that such precise dimensions be retained during subsequent processing steps. However, these processing steps may involve thermal exposure at temperatures where a glass may undergo structural rearrangement and/or dimensional relaxation. Accordingly, it has become common practice to subject glass panels to a compaction process. This occurs after formation of the panel, and before further thermal processing during device formation.

Compaction involves reheating a glass body to a temperature below the glass softening point, but equal to or above the maximum temperature reached in a subsequent processing step. This achieves structural rearrangement and dimensional relaxation in the glass prior to, rather than during, the subsequent processing. It will be appreciated that the time held at a particular temperature will be based upon the time required for the particular processing step. Structural rearrangement and dimensional relaxation in a glass will take place more rapidly as the temperature is raised. It will be recognized that the time required therefore will be shorter as higher temperatures are utilized. Preliminary compaction is imperative where it is necessary to maintain precise alignment and/or flatness in a glass body during subsequent photolithographic processing. This is often the case in the manufacture of active panels for flat panel display devices.

It is economically attractive to compact glass sheets in stacks. However, this necessitates interleaving, or separating, adjacent sheets with a release material to avoid sticking. At the same time, it is necessary to maintain the sheets extremely flat, and with an optical-quality surface finish.

The panels used in an LCD device must, of course, be of optical quality. Strict cleanliness is a requirement during all processing. Any marring of the surface, such as surface scratches, indentations, or the like, must be avoided.

It has been proposed, in U.S. Pat. No. 5,073,181 (Foster et al.), to substitute a monolayer of submicron silica particles as a parting layer. However, this still requires removal, and, consequently, further handling.

Accordingly, a pending application discloses applying a permanent barrier layer film that performs the dual function of a parting layer during compaction. The film is colorless and transparent, is deposited from an atmosphere of an atomized, or ionized, refractory material, or reactive precursor, and is 50-500 nm thick. The application is Ser. No. 08/132,554, a continuation-in-part of Ser. No. 07/853,587, filed Mar. 18, 1992, in the name of F. P. Fehlner, and assigned to the same assignee as the present application.

Glasses displaying strain points as low as about 560° C. are operable in the present invention. However, the temperatures to which LCD substrates are exposed have been continually increasing in recent years. Therefore, the preferred glasses will exhibit strain points greater than 560° C. and, most preferably, in excess of 650° C.

In order to consistently achieve the requisite optical quality in LCD panels, it would be desirable to avoid separate processing steps to the extent possible. In particular, it would be highly desirable to compact the glass substrate and crystallize a silicon film in one integrated operation. Any interfacial damage could then be annealed out and glasses with lower strain points employed.

It is then a basic purpose of the present invention to provide a method that incorporates these desired features. A specific purpose is to provide an improved method of producing a panel for an AMLCD device. Another specific purpose is to provide a novel means of producing a poly-Si film suitable for TFT fabrication on a compacted glass panel.

SUMMARY OF THE INVENTION

In fulfillment of these and other purposes, our invention resides in a method of producing a glass panel for silicon device fabrication which comprises forming a noncrystalline or mixed-phase, silicon film on a glass substrate, the glass having a strain point greater than 560° C., and subjecting the filmed glass to a heat treatment comprising heating at a temperature of at least 550° C., for a period of time sufficient to convert the silicon film to polycrystalline silicon and compact the glass. The logarithm of the time required is dependent upon the inverse of the absolute temperature employed.

The preferred practice of the present invention contemplates carrying out the compaction of the glass and crystallization of the silicon film essentially concurrently. It will be appreciated, however, that, although less economically practical, the two procedures may be conducted serially. To illustrate, a sample of Corning Code 7059 glass could be compacted by heating for a predetermined period of time at a temperature no lower than about 10° C. below its strain point of ~593° C., to compact the sample. Thereafter, the silicon film could be deposited on the sample and the sample subsequently heated to at least 550° C., but lower than 590° C., for a pre-determined period of time to crystallize the silicon film. The crystallization of the silicon film could be undertaken at temperatures in excess of 590° C. Such temperatures would, in effect, "recompact" the glass such that, in reality, the compaction and crystallization would occur concurrently.

BRIEF DESCRIPTION OF THE DRAWING

The single FIGURE in the drawing is a side view in cross-section of a panel in accordance with the present invention.

DESCRIPTION OF THE INVENTION

The single FIGURE illustrates an arrangement of films in a preferred embodiment of the invention. The film stack is deposited on a glass substrate 10 having a strain point of greater than 560° C. Such glasses include Corning Code 7059 as well as those disclosed, for example, in the Dumbaugh et al. patents mentioned earlier.

The first member of the preferred film stack is a barrier layer 12. This prevents migration of sodium ions and reaction of the silicon layer with the glass. Barrier layer 12 may, for example, be a layer of silica 100 nm thick. As described in the copending Fehlner application mentioned above, the silica barrier layer may be deposited on-line. That is, it may be deposited using atmospheric pressure (AP) chemical vapor deposition (CVD) as the panel glass is being drawn. Alternatively, it may be deposited off-line in a separate operation before successive films are deposited. The film may then be deposited using AP, low pressure (LP), plasma enhanced (PE) CVD, or physical vapor deposition (PVD), such as sputtering. Where greater protection against sodium ion migration is desired, a second barrier, for example alumina or silicon nitride, might be deposited on the glass prior to the silica.

Next, a silicon layer 14 is deposited over barrier layer 12. This layer will typically be deposited temperatures between about 300°–560° C. As deposited, layer 14 is a noncrystalline, or mixed-phase, film, preferably about 100–200 nm thick. It should have minimal hydrogen content. This avoids formation of gas bubbles during subsequent heat treatment. Silicon layer 14 may contain fluorine as an aid in passivation of "dangling" silicon bonds.

A capping layer 16 of silica may then be deposited. This will help to stabilize the silicon layer 14 during crystallization, as well as prevent contamination. Ultimately, however, layer 16 may be removed prior to transistor production. Layer 16 may, for example, be 100 nm thick.

It will be appreciated that film thickness may vary. The thicknesses mentioned were found preferable in our work. The silicon film and capping layer may be deposited by either CVD or PVD.

The present invention is primarily concerned with silicon layer 14. Barrier layer 12 and protective cap are highly desirable, and represent a preferred embodiment of the invention. However, they are optional.

Our invention is based on our discovery that a noncrystalline, or mixed-phase, silicon film, deposited on a glass with a strain point of greater than 560° C., can be converted to a polycrystalline silicon film having desirable crystal size. It is further based on our finding that this conversion can occur on a time-temperature cycle that is effective to compact the glass so that shrinkage of the glass in subsequent processing is less than 10 parts per million (ppm). Compaction is discussed in detail in the copending Fehlner application noted earlier.

For example, we have found that heat treatment of a Corning Code 1735 glass for 70 hours at 645° C. effectively compacts the glass while converting a noncrystalline silicon film to a polycrystalline film having a desired crystal size of about 0.5 micron. Thus, our invention makes it possible to combine crystallization of a non-crystalline silicon film with compaction of a glass in a single, simultaneous, heat treatment step.

Preliminary testing was carried out on noncrystalline silicon films deposited on glass substrates by a PECVD unit at 300° C. The heat treatment temperature was only approximate.

A 0.5 micron thick silicon film was deposited on a substantially alkali-free glass having a high strain point. This test piece was heat treated for 24 hours at approximately 640° C. XRD measurements on the treated test piece showed three peaks indicating crystal development. A fluoride-doped silicon film was given the same treatment. XRD measurement showed the same pattern of three peaks.

Finally, a 0.5 micron thick film was deposited on a glass having a higher strain point. This test piece was heat treated for two hours in air at approximately 730° C. XRD measurements showed the same three peaks as previously observed.

These initial results showed that the PECVD silicon films did recrystallize. However, the films were not considered for device fabrication inasmuch as the lack of a barrier layer could allow contaminants from the glass to enter the silicon film. It was also not known whether the grain size of the silicon was correct.

Literature points out that there is an ideal grain size based on the following tradeoff. Larger grains lead to fewer grain boundaries and, hence, fewer electron traps which reduce carrier mobility. On the other hand, all TFTs in an array of TFTs must perform in a similar manner. Hence, each TFT should have the same average number grain boundaries in the gate region.

These two conflicting demands are met by having five to ten grain boundaries in each TFT gate region. Hence, the silicon grain size is the length of the gate region divided by the number of grains. A five to ten micron gate length is often used. In that case, the silicon grain size should be approximately 0.5–1.0 micron. However, smaller grain sizes, e.g., 0.2 microns, are appropriate for a smaller gate length.

The next step was to prepare film stacks, such as shown in the drawing. The film stacks were prepared on three different types of glass substrates, the glass substrate having been carefully cleaned prior to film deposition. The three glasses employed had the compositions and properties shown below. The compositions are calculated in percent by weight from the batch on an oxide basis and exclude fining agents and impurities. Corning Code 0215 is a soda lime glass marketed by Corning Incorporated.

|  | Code 0215 | Code 7059 | Code 1735 |
| --- | --- | --- | --- |
| $SiO_2$ | 72.1 | 50 | 56.9 |
| $Al_2O_3$ | 1.8 | 10 | 14.5 |
| $B_2O_3$ | — | 15 | 4.7 |
| CaO | 7.3 | — | 11.1 |
| BaO | — | 25 | 12.4 |
| MgO | 3.8 | — | — |
| SnO | — | — | 0.2 |
| $Na_2O$ | 14.0 | — | — |
| $K_2O$ | 0.2 | — | — |
| Strain Point (°C.) | 511 | 593 | 671 |
| CTE × $10^{-7}$/°C. | 89.4 | 46 | 49 |

The films were deposited using a Surface Technology Systems Multiplex PECVD unit operated under these conditions:
Common Process Conditions
RF power—400 W
Pressure—550 mT
Temperature—300° C.
Gas Flow Rates (sccm)
For $SiO_2$: 5% $SiH_4$ in Ar—1000 $N_2O$—1500
For Si: 5% $SiH_4$ in Ar—2000
For F-doped Si/F: 5% $SiH_4$ in Ar—2000 $SiF_4$—200
Argon, instead of hydrogen, was used as the carrier gas for silane to minimize incorporation of hydrogen in the silicon films, The fluorine doping of Si was designed to help passivate both the barrier layer/silicon interface and the silicon grain boundaries by terminating silicon "dangling" bonds,

| Film | 1 | 2 | 3 | 4 |
| --- | --- | --- | --- | --- |
| Reaction Time (sec) | | | | |
| Barrier Layer | 39 | 39 | 20 | 20 |
| Silicon | 181 | 0 | 91 | 181 |
| Si/F | 0 | 181 | 0 | 0 |
| Capping Layer | 39 | 39 | 20 | 20 |
| Film Thickness (nm) | | | | |
| Barrier Layer | 200 | 200 | 100 | 100 |
| Silicon | 200 | 0 | 100 | 200 |
| Si/F | 0 | 200 | 0 | 0 |
| Capping Layer | 200 | 200 | 100 | 100 |

The color of the film stacks in transmission was a brown-orange.

Heat treatment of a set of Code 1735 samples was carried out in a box furnace having much improved temperature control compared to the above preliminary experiments, A set consisted of one sample from each silicon run. The samples were cut 1"×1" (2.5 cm×2.5 cm), and cleaned, They were stacked four deep with the film side up in a stainless steel holder, The holder rested on a refractory block. Heat treatment at 645° C. for 70 hours was carried out in air. The relative humidity was low, approximately 20%.

The color of the film stacks turned to a light lemon yellow after heat treatment. This is characteristic of recrystallized silicon films. However, it was necessary to know the size of the crystallites formed during the heat treatment. Towards this end, X-ray diffraction (XRD), atomic force microscopy (AFM), and transmission electron microscopy (TEM) were employed. The color indication of crystallization was confirmed by X-ray diffraction. An essentially random orientation of (111), (220), and (311) grains was found. Grain size was approximately 100 nm in the Z direction. Atomic force microscopy (AFM) and transmission electron microscopy (TEM) showed that the X-Y dimensions varied from 200 to 500 nm. No gas bubbles were observed in the crystallized film.

The coated samples, when stacked with the film sides up and heat treated in air for 70 hours at 645° C. did not stick together, thus indicating successful, damage-free compaction.

Further testing of sample sets as prepared above involved heat treatments using various time-temperature conditions dependent on the glass substrate. The times reported in the paper of Blum and Feldman for conversion of noncrystalline silicon films to polycrystalline ones were exceeded to insure full crystallization of the silicon films.

The Corning Code 0215 samples were processed at 573° C. for 15 days while exposed to laboratory atmosphere having a relative humidity of approximately 50%. This temperature is 62° C. above the strain point of the glass. As a result, there was glass flow and the film surface became crinkled. This resulted in adhesion between the four samples. X-ray diffraction showed that the silicon films had crystallized. The conclusion is that the combined compaction-crystallization process will not work with soda lime glass.

Heat treatment of the Corning Code 7059 samples was carried out at 622° C. for 48 hours in a laboratory atmosphere with an approximate relative humidity of 40%. None of the samples stuck to each other and the silicon films became lemon yellow in transmission. X-ray diffraction showed that all four samples had crystallized. The peak height of the (111) line for the thinner silicon film was approximately half that of the thicker films.

A second set of Corning Code 1735 samples was heat treated, at 645° C./1 hour plus 661° C./3 hours, in a laboratory atmosphere with relative humidity of approximately 40%. None of the samples stuck together. Most of the film area in those samples lacking fluorine were lemon yellow and crystalline by X-ray diffraction. The fluorine containing sample was noncrystalline, indicating that fluorine slows the rate of crystallization. However, as indicated above, the fluorine-containing samples do eventually crystallize.

It was concluded that a heat treatment process that would compact the glass substrate resulted in crystallization of the silicon film. Thus, both processes can be carried out simultaneously in a single heat treatment.

We claim:

1. A method of producing a glass panel for a LCD device consisting of a polycrystalline silicon film on a compacted glass substrate, said glass having a strain point of at least 560° C., comprising the steps of:
   (a) heating said glass substrate to a temperature of at least 550° C. for a period of time sufficient to compact the glass;
   (b) applying a noncrystalline, or mixed-phase, silicon film on said glass substrate; and thereafter
   (c) heating said glass substrate to a temperature of at least 550° C. for a period of time sufficient to convert the silicon film to polycrystalline silicon.

2. A method in accordance with claim 1 wherein the noncrystalline, or mixed-phase, silicon film is applied in the temperature range of 300°-560° C.

3. A method in accordance with claim 1 wherein the noncrystalline, or mixed-phase, silicon film is in the range of 100-200 nm thick.

4. A method in accordance with claim 1 wherein the silicon film is doped with fluorine.

5. A method in accordance with claim 1 wherein the silicon film is subjected to a heat treatment sufficient to grow crystals in size range of 200-1000 nm.

6. A method in accordance with claim 1 wherein a barrier layer film is deposited intermediate to the silicon film and the glass to prevent migration of sodium ions and reaction of the silicon layer with the glass.

7. A method in accordance with claim 6 wherein the barrier layer is composed of silica.

8. A method in accordance with claim 1 wherein a protective layer of silica is deposited over the noncrystalline, or mixed-phase, silicon film.

9. A method in accordance with claim 1 wherein the temperature employed to compact the glass is no lower than about 10° C. below the strain point of the glass.

10. A method in accordance with claim 1 which comprises applying the noncrystalline, or mixed phase, silicon film by PECVD.

11. A method in accordance with claim 1 which comprises heating the glass substrate for a period of time sufficient to form, in the noncrystalline, or mixed-phase, silicon film crystals wherein the grain size equals the length of the gate region divided by the number of grains.

12. A method of producing a glass panel for an LCD device comprising polycrystalline silicon film on a compacted glass substrate, the glass having a strain point greater than 560° C., comprising the steps of:
   (a) applying a noncrystalline, or mixed-phase, silicon film on the glass substrate,
   (b) heating the filmed glass substrate to a temperature of at least 550° C.,
   (c) holding the filmed glass substrate at such temperature for a period of time sufficient to both convert the silicon film to a polycrystalline silicon film, and to compact the glass substrate.

13. In a method of producing a glass panel for an LCD device, the glass having a strain point of at least 560° C., which comprises compacting the glass in a first heat treatment, applying a non-crystalline, or mixed-phase, silicon film to the compacted glass, and converting the silicon film to a polysilicon film in a second heat treatment, the improvement which comprises applying the non-crystalline, or mixed-phase silicon film to an uncompacted glass panel, heating the silicon-filmed glass panel to a temperature of at least 550° C., and holding the glass panel at that temperature for a time sufficient to both compact the glass and to convert the silicon to a polysilicon film.

14. A method in accordance with claim 1 wherein the temperature of the heating step is less than 62° C. above the glass strain point.

* * * * *